United States Patent [19]

Dandia

[11] Patent Number: 5,749,999

[45] Date of Patent: May 12, 1998

[54] METHOD FOR MAKING A SURFACE-MOUNT TECHNOLOGY PLASTIC-PACKAGE BALL-GRID ARRAY INTEGRATED CIRCUIT

[75] Inventor: Sanjay Dandia, San Jose, Calif.

[73] Assignee: LSI Logic Corporation, Milpitas, Calif.

[21] Appl. No.: 191,887

[22] Filed: Feb. 4, 1994

[51] Int. Cl.⁶ .......................... H01L 21/58; H01L 21/68; H05K 13/04
[52] U.S. Cl. .............................. 156/285; 156/293; 269/21
[58] Field of Search .................... 156/285, 297, 156/298, 293; 437/212, 209; 269/21; 279/3; 427/238, 289, 290, 294, 97

[56] References Cited

U.S. PATENT DOCUMENTS

| | | | |
|---|---|---|---|
| 2,366,935 | 1/1945 | Schmid | 451/388 |
| 3,724,835 | 4/1973 | Gnoth | 269/21 |
| 3,729,206 | 4/1973 | Cachon et al. | 269/21 X |
| 3,907,268 | 9/1975 | Hale | 269/21 |
| 4,521,995 | 6/1985 | Sekiya | 451/388 |
| 4,603,466 | 8/1986 | Morley | 451/388 X |
| 4,693,036 | 9/1987 | Mori | 451/289 |

*Primary Examiner*—Michael W. Ball
*Assistant Examiner*—Francis J. Lorin
*Attorney, Agent, or Firm*—Poms, Smith, Lande & Rose

[57] ABSTRACT

A method of making a surface-mount technology plastic-package ball-grid array integrated circuit assembly. According to the method, a surface-mount ball-grid array package is provided for an integrated circuit assembly. The array package has a circuit chip recess through which vias extend, opening on a bottom surface of the array package. A peripheral portion of the array package is defined around the vias formed in the recess. The array package is held on a vacuum chuck by applying vacuum to the peripheral portion of package. An adhesive material is then placed in the recess to extend partially through the vias. A circuit chip is finally disposed in the recess on the adhesive material to complete the fabrication process. Substantially ambient pressure is communicated to the vias on the bottom surface of the array package to prevent the adhesive from being pulled through the vias by the applied vacuum.

4 Claims, 2 Drawing Sheets

METHOD FOR MAKING A SURFACE-MOUNT TECHNOLOGY PLASTIC-PACKAGE BALL-GRID ARRAY INTEGRATED CIRCUIT

FIELD OF THE INVENTION

The present invention is in the field of integrated circuits. More particularly, the present invention is in the field of integrated circuits having a plastic package using surface mount technology of the ball grid array type. Still more particularly, the present invention relates to a surface-mount plastic package ball-grid array integrated circuit which is manufactured using an improved method and apparatus to provide both an improved yield of integrated circuits from the manufacturing process as well as an improved integrated circuit of better reliability being less prone to damage and circuit failure during a surface-mount solder reflow installation step of manufacture.

RELATED TECHNOLOGY

Integrated circuits having plastic packages of the surface-mount ball-grid array type are known conventionally. That is, integrated circuits are known which are available in plastic packages. The plastic packages are configured to use surface-mount electrical contacts connected to external circuitry, as opposed to depending on electrical contact legs which are received into a socket or soldered into conductive vias of a printed circuit board, for example. Still further, the conventional surface-mount technology of such packages is known to use the solder ball reflow technique of surface mounting the integrated circuit package. In this mounting method an array of fine-dimension solder balls is positioned in a grid matching both the locations of conductive vias (electrical contacts) of the integrated circuit package, and also matching the positions of corresponding electrical contacts of a circuit board to which the integrated circuit is to be mounted. The juxtaposed circuit board and integrated circuit package with interposed solder balls is then heated just sufficiently to reflow the solder balls, effecting the mounting and electrical connection of the integrated circuit package to the circuit board. An adhesive or potting compound may additionally be used to secure the integrated circuit to the circuit board.

However, with the conventional technology, when the integrated circuit itself is placed into its package during the manufacturing process, a thermally conductive, electrically non-conductive adhesive is normally used to secure the integrated circuit die or chip into a recess of a base portion of the package. During this automated manufacturing process, the integrated circuit package is held in place on a vacuum chuck by applied vacuum and atmospheric pressure. The thermally conductive adhesive extends partially through vias of the package toward the back surface thereof to provide a heat transfer path from the integrated circuit toward the circuit board or heat sink upon which the integrated circuit is disposed as installed. As will be understood, this heat transfer path for cooling the integrated circuit chip is an important feature because the plastic material of the package itself in not a particularly good heat conductor, and the circuit chip produces heat during operation which must be carried to ambient temperature. While some heat transfer occurs without the presence of the adhesive, this adhesive has been found to substantially facilitate heat transfer. In order to prevent at this stage of manufacture the thermally conductive adhesive from being pulled through the vias by the vacuum of the vacuum chuck, these vias are closed on the back side of the package by a non-conductive film or solder resist, for example. These closed vias must be opened later, however, before the finished package is exposed to the heating necessary for solder reflow during the surface-mount attachment step of the packaged integrated circuit to the circuit board.

Such step of opening the closed vias is necessary because the vias have some void volume therein which may contain volatile materials. For example, a small amount of water moisture is sufficient if trapped in the closed vias under the integrated circuit chip to expand from the elevated temperature of the solder reflow mounting process, and blister or delaminate the plastic package of the integrated circuit. The integrity of the electrical connections within the package and of the integrated circuit itself are normally too much in doubt after a delamination of the package to risk use of such a damaged integrated circuit package. Of course, unpackaging, retesting, and repackaging the integrated circuit chip are not economically feasible. Delamination of the plastic package also renders the integrated circuit unusable because the package is typically too distorted to provide reliable electrical connections with the circuit board during the ball grid array attachment process. Consequently, a package defect, such as a delamination described above, results in the entire package and integrated circuit chip (essentially a finished product with all expenses already sunk into it) being scrapped.

In order to avoid the problem described above, conventional manufacturing methods include a step in which the non-conductive film or coating of solder resist is punctured at the back side of the package. The puncturing of the film and opening of the vias to ambient provides a vent path for any volatile materials which are vaporized during the solder reflow step. Accordingly, blistering of the integrated circuit packages by pressure caused from volatile materials trapped in the vias is avoided. However, this manufacturing step of puncturing the film or coating of solder resist at the package back side adds another step and additional cost to the manufacturing operation.

As a result of the problem described above, some consideration has been given and evaluation attempts have been made to manufacture the integrated circuit package with the vias open both in the chip-receiving recess and on the bottom surface of the package. However, this method of manufacturing the packaged integrated circuits caused the vacuum from the vacuum chuck to draw the adhesive from the chip-receiving recess onto the back surface of the package. This misplaced adhesive is a contaminant on the backside of the package and presents the risk of interference with the electrical connections which must be made to the electrical contacts of the package using the solder ball grid array. Also, the adhesive may migrate into the manufacturing machinery and contaminate successive packages moving through the manufacturing machines. Finally, such misplaced adhesive may be sufficiently conductive or may retain conductive dust or other contaminants in locations between the electrical connections of the package so that electrical shorting results between these contacts.

SUMMARY OF THE INVENTION

In view of the deficiencies of the conventional technology outlined above, an object for this invention is to provide a method of making a surface-mount technology plastic-package ball-grid array integrated circuit having vias in the chip-attach cavity or recess which are open at each end without a necessity for a separate manufacturing step to open these vias after mounting of the circuit chip in the cavity so as not to trap volatile materials therein which subsequently could cause blistering of the package during solder reflow for surface mounting of the packaged integrated circuit.

Further to the above, an object for this invention is to provide a manufacturing method and apparatus for making such a surface-mount technology plastic-package ball-grid array integrated circuit.

Accordingly, the present invention provides according to one aspect thereof, a surface-mount technology plastic-package ball-grid array integrated circuit having vias in the chip-attach cavity or recess which are open at each end without a necessity for a separate manufacturing step to open these vias after mounting of the circuit chip in the cavity.

According to another aspect of the present invention, a vacuum chuck for use in manufacturing the inventive surface-mount technology plastic-package ball-grid array integrated circuit and which includes an island of ambient pressure congruent with the open vias of the chip package during the adhesive mounting of the integrated circuit chip in this cavity is provided.

An advantage of the present invention resides in the simplified and less expensive inventive manufacturing process and apparatus which may be used to manufacture the surface-mount technology plastic-package ball-grid array integrated circuits, and in the improved and more reliable product which results from this manufacturing process.

These and additional objects and advantages will be apparent from a reading of the following detailed description of a single exemplary preferred embodiment of the invention taken in conjunction with the following drawing Figures, in which:

DESCRIPTION OF THE PREFERRED EXEMPLARY EMBODIMENT OF THE INVENTION

Figure 1:
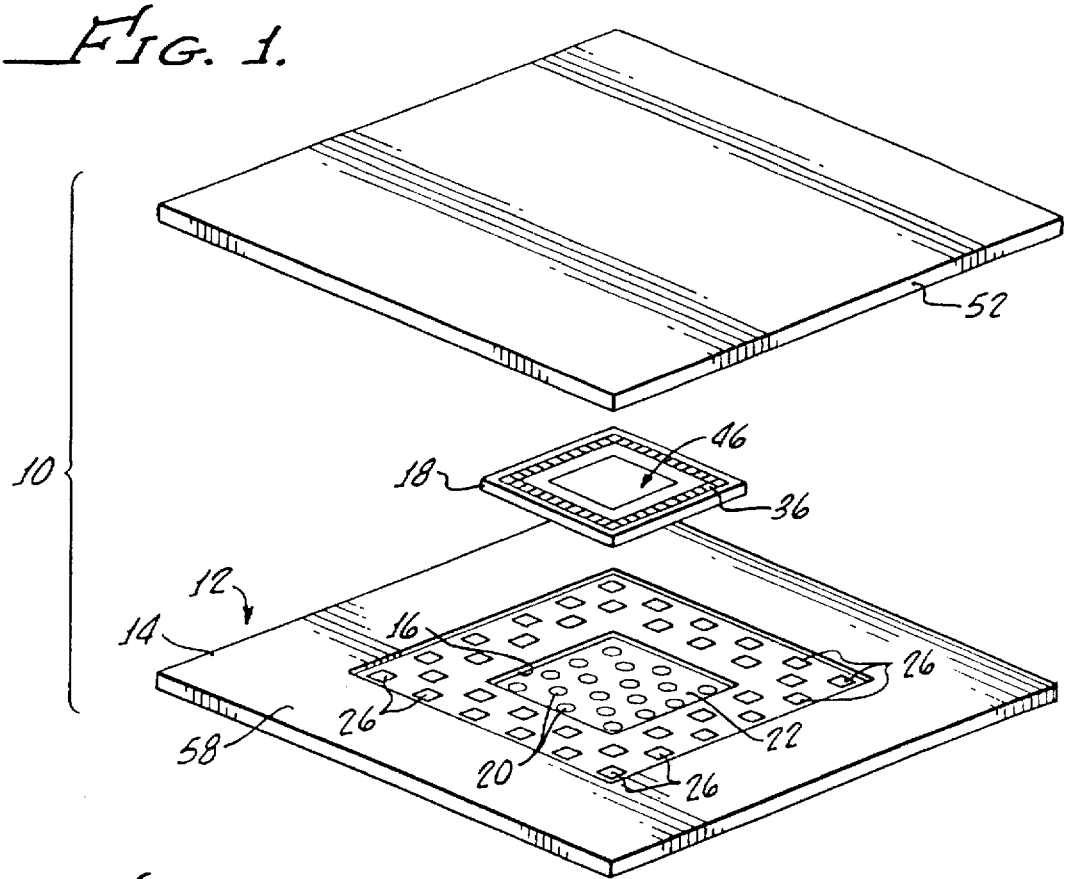
FIG. 1 is an exploded perspective view of a plastic package surface mount integrated circuit assembly with an integrated circuit chip and electrical interconnection device.
Figure 2:
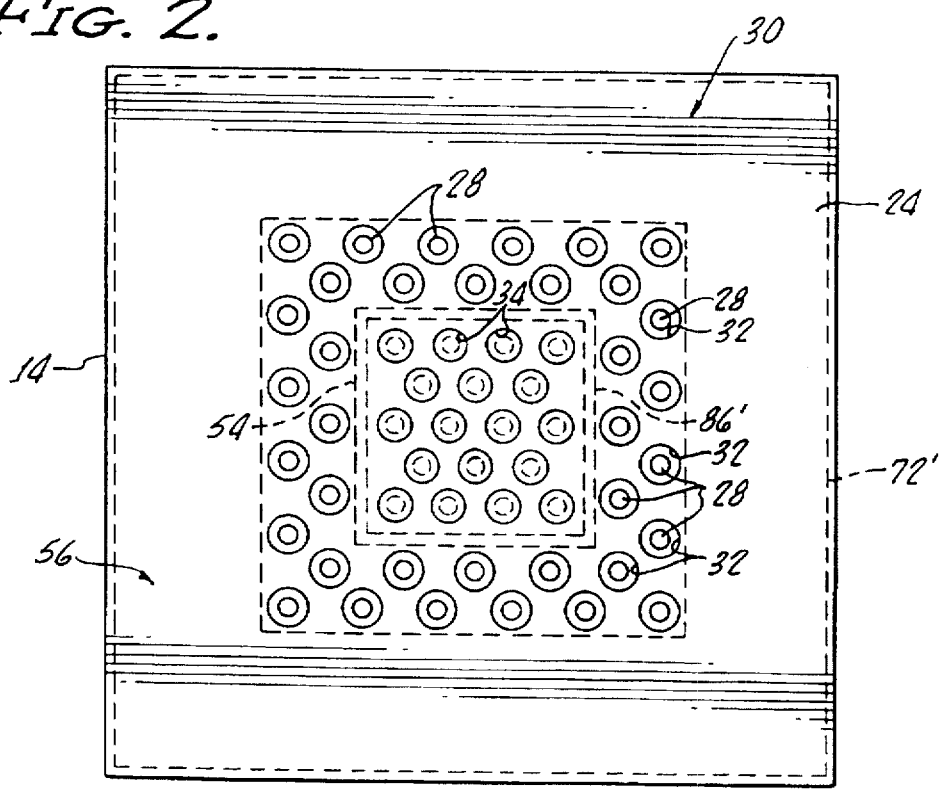
FIG. 2 is a view similar to FIG. 1, but showing the bottom surface of the integrated circuit package.

Viewing FIGS. 1 and 2 in conjunction, a surface-mount technology plastic-package ball-grid array integrated circuit assembly 10 is depicted in exploded view. The integrated circuit assembly 10 includes a two-part package, generally indicated with the numeral 12. This package 12 includes a base member part 14, which is a generally planar body of plastic material which is square in plan-form, and which defines a recess 16 into which an integrated circuit chip 18 is receivable. The base 14 defines a plurality of vias or passages 20 opening on the floor 22 of the recess 16, and also opening on the bottom surface 24 of the base member 14, as is visible in FIG. 2.

Surrounding the recess 16, the base member 14 carries a plurality of electrical contacts 26. Typically the contacts 26 are disposed in a stepped recess as shown in FIG. 1. Of course, the region of the base member 14 carrying the contacts 26 could also be level with the floor 22 of the recess 16. These contacts 26 each individually connect electrically to corresponding ones of plural electrical contacts 28 disposed on the bottom surface 24 of the base member 14, also as is seen in FIG. 2. The electrical contacts 28 may be essentially flush with the bottom surface 24 of the package 12, or may protrude or be recessed slightly. However, carried on the bottom surface 24 of the base member 14 is a film or coating of solder resist material 30. This solder resist material defines plural openings 32 corresponding to the plurality of contacts 28. In other words, each of the plural contacts 28 is disposed in a corresponding one of the plural openings 32, and is surrounded by the coating or film 30 of solder resist material to be separated from adjacent contacts by an interposed portion of the solder resist film or coating. The solder resist film or coating 30 also defines a plurality of openings 34 corresponding to the vias 20 so that these vias open on the lower surface of the package 12 despite this solder resist film or coating.

As will be seen, the package 12 receives the chip 18 into the recess 16, there to be secured by an adhesive material (not seen in FIGS. 1 or 2). Viewing FIG. 1, it is seen that the chip 18 includes plural peripherally-disposed fine-dimension electrical contacts, generally referenced with the numeral 36 corresponding to the individual contacts of the plurality of contacts 26 carried on the base member 14. Typically the individual contacts 36 are electrically connected to their corresponding individual contacts 26 by wire bonding 38 (see FIG. 3). The use of wire bonding connection technology is widely known in the semiconductor integrated circuit packaging art.

Still viewing FIG. 1, it is seen that the package 12 includes a cover portion 52 which sealingly cooperates with the base portion 14 to provide a sealed and protected environment for the integrated circuit chip 18. During manufacturing of the integrated circuit assembly 10, the package cover portion 52 is sealingly attached to the base portion 14, for example, by use of a potting compound or epoxy. As a result, the integrated circuit chip 18 is environmentally protected once the manufacturing operations are completed to install the chip in the package 12 and to close this package. Alternatively, the cover portion 52 may be replaced with a simple layer of epoxy or other potting compound to provide environmental closure for the package 12, and for the integrated circuit chip 18 therein.

FIG. 2 shows by use of the dashed line 54 that outwardly of the recess 16, an annular or peripheral area 56 is defined on the bottom surface 24 of the package 12 within which the contacts 28 are disposed, but which is closed with respect to fluid communication between the upper surface 58 of the base member 14 and the lower surface 24 of this base member. Within the dashed line 54 (that is, within the surrounding peripheral area 56), the vias 20 provide fluid communication between the recess 16 and the bottom surface 24 of the package base member 14.

Figure 3:
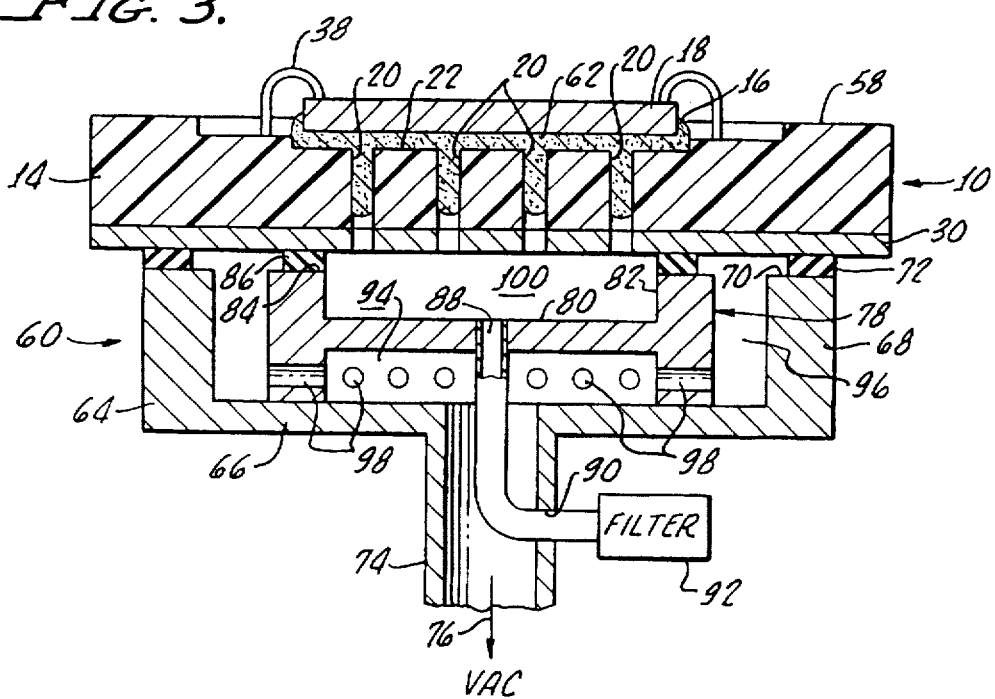
FIG. 3 provides and enlarged fragmentary partially cross sectional view of the integrated circuit package and circuit chip as they would appear at a particular step of manufacturing, and as disposed on an inventive manufacturing apparatus according to the present invention.
Figure 4:
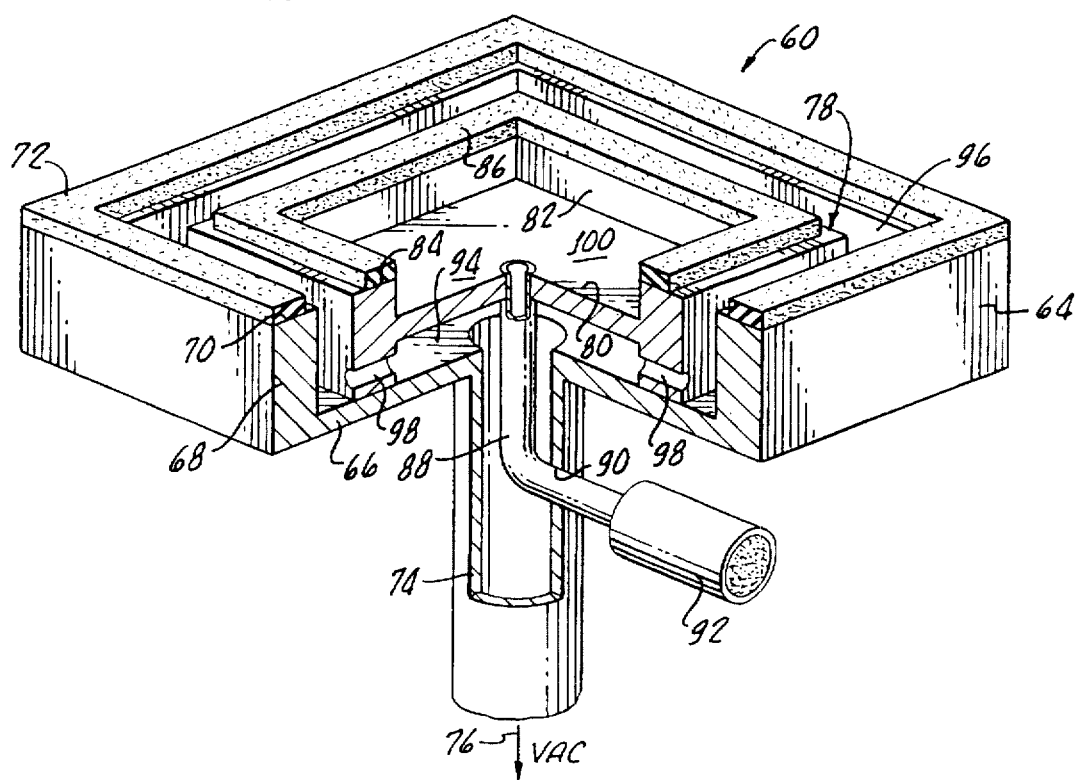
FIG. 4 provides a perspective view of the manufacturing apparatus seen also in FIG. 3, with a portion of the apparatus broken away to better illustrate the structure.

FIGS. 3 illustrates the integrated circuit assembly 10 at an intermediate stage of manufacture and disposed on a vacuum chuck 60, which is also illustrated in FIG. 4 without the package 12. In order to better illustrate salient features of the invention, FIG. 3 shows the recess 16 and chip 18 greatly enlarged in comparison with the size of base position 14. This size distortion is carried over into FIG. 4 for consistency of illustration. At the stage of manufacturing depicted in FIG. 3, the base member 14 is disposed on the vacuum chuck 60 and is there retained by an applied vacuum in conjunction with ambient pressure, as will be further explained. The base member 14 first receives into the recess 16 a quantity of an adhesive material 62 initially in a semi-liquid state, and the integrated circuit chip 18 is then disposed on this adhesive material 62 to be permanently retained in the recess 16 when the adhesive 62 cures to a solid state. At this stage of manufacture, the wire bond 38 is not yet applied to electrically connect the circuit chip 18 to the base member 14.

Viewing FIG. 4, it is seen that the vacuum chuck 60 includes a base member 64 having a floor portion 66 and an upwardly extending peripheral wall portion 68. The wall portion 68 terminates in a generally horizontal circumferentially continuous edge surface 70, which matches the size and shape of the outer extent of the peripheral area 56 of the package base member portion 14, recalling FIG. 2. This edge surface 70 carries a peripheral outer sealing member 72, which is sealingly engageable with the lower surface 24 of the package base 14 generally at a sealing line, the outer extent of which is indicated at 72', seen in FIG. 2. Downwardly through the center of the floor portion 66 opens a vacuum conduit 74, which communicates to a controllable source of vacuum, as is indicated by the arrow 76.

Within the wall 68 and upon floor 66 sets an island member, generally referenced with the numeral 78. This island member 78 similarly includes a floor portion 80 which is spaced above the floor 66 by an upwardly extending wall portion 82. The wall portion terminates at an upper edge surface 84, which matches the size and shape of the inner extent of the peripheral area 56 of the package base member 14, again recalling FIG. 2. This edge surface 84 carries a circumferentially extending inner peripheral sealing member 86. The edge surfaces 70 and 84 are generally at the same elevation or generally in a common plane so that the sealing members 72 and 86 are generally coplanar. As a result, peripheral sealing member 86 sealingly engages the lower surface 24 of the package base member 14 generally at a sealing line, the inner extent of which is indicated at 86', which is seen in FIG. 2. The sealing lines 72' and 86' are each disposed within the area 56 of the package base member 14.

Centrally through the floor portion 80 of the island member 78, an ambient air conduit 88 opens downwardly and extends a distance within the vacuum conduit 74 to communicate through the wall of this latter conduit at 90 in order to outwardly communicate with an air filter member 92. The conduit 88 thus communicates the internal portion of island member 78 with ambient air, as will be further explained. Because the floor 80 is spaced above the floor 66, the base member 64 and island member 78 cooperate to define a chamber 94 communicating with the vacuum source 76. This chamber 94 communicates with a peripheral moat-like or groove-like vacuum recess 96 defined between the two walls 68 and 82 via a plurality of passages 98 formed in the latter wall portion. Within this peripheral vacuum recess 96, the island member 78 defines an ambient air island or basin 100, recalling the ambient air conduit 88 described above.

Viewing FIG. 3, it is seen that when the package base member 14 is disposed on the vacuum chuck 60 in sealing cooperation with the sealing members 72 and 86, the peripheral vacuum recess 96 and ambient air basin 100 are transformed into respective chambers, the former communicating with the vacuum source 76, and the latter communicating with the ambient air via the conduit 88 and filter 92. As FIG. 3 more particularly shows, with the package base member portion 14 disposed on the vacuum chuck 60 and there retained by applied vacuum effective within the peripheral area 56 between the sealing lines 72' and 86', recalling FIG. 2, no vacuum is applied to the vias 20. Initially, the chip recess 16 communicates with ambient air pressure by way of the vias 20. However, when the adhesive material 62 is placed in the recess 16, and the chip 18 is placed on this adhesive, the vias 20 are closed. Under these conditions, the communication with ambient pressure provided by the conduit 88 and filter 92 insures that ambient air pressure is maintained in the chamber 100 (viewing FIG. 3) even if should there be only an imperfect seal between the base member 14 and the sealing member 86. That is, a vacuum leak at the seal 86 will not pull down the pressure in chamber 100 to a vacuum.

Further to the above, the adhesive material 62 may extend downwardly in the vias 20 under its own weight and surface tension to advantageously provide a conductive heat transfer path from the chip 18 toward a circuit board or heat sink which will be adjacent to the surface 24 as the package 10 is installed in its use environment. Understandably, the extent of downward flow of the adhesive 62 along the vias 20 can be controlled quite precisely by controlling the rheology, viscosity, surface tension and amount of the adhesive which is placed into the recess 16 prior to placement of the chip 18. However, the vias 20 are not exposed to vacuum during the manufacturing step illustrated in FIG. 3, and the adhesive 62 is not drawn through the vias 20 and into the vacuum chuck 60 or onto the lower surface 24 of the integrated circuit assembly 10.

Still further, when manufacturing of the integrated circuit package assembly 10 is complete, this package assembly is surface mounted to a circuit board using an array of solder balls at the contacts 28. These solder balls are then heat reflowed to effect the necessary electrical connections between the integrated circuit package 12 and the circuit board on which it is to be mounted in its use environment. The open vias 20 of the package assembly 10 cannot trap volatile materials which might be vaporized during this solder ball heat reflowing process to blister the package 12. Consequently, the problem of blistering and destruction of the completed conventional integrated circuit package assemblies during this surface-mounting step described above with respect to conventional packages is avoided by the present invention. This advantage is achieved by the present invention also without the necessity of a separate manufacturing step to open previously closed vias after the chip 18 has been adhesively secured into the recess 16.

While the present invention has been depicted, described, and is defined by reference to a particularly preferred embodiment of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiment of the invention is exemplary only, and is not exhaustive of the scope of the invention. Consequently, the invention is intended to be limited only by the spirit and scope of the appended claims, giving full cognizance to equivalents in all respects.

I claim:

1. A method of making a surface-mount technology plastic-package ball-grid array integrated circuit assembly, said method comprising the steps of:

providing for said integrated circuit assembly a surface-mount ball-grid array package which has a circuit chip recess from which through vias extend to open on a bottom surface of said package;

holding said package on a vacuum chuck by applying vacuum to a peripheral portion of said package around said vias;

communicating substantially ambient pressure to the openings of said vias on said bottom surface of said package;

placing an adhesive material in said recess to extend partially through said open vias; and disposing a circuit chip in said recess on said adhesive material.

2. The method of claim 1 further including the steps of isolating said through vias from said applied vacuum.

3. The method of claim 2 further including the steps of:

configuring said vacuum chuck to include an outer wall portion upon which said integrated circuit assembly package is sealingly receivable;

providing within said outer wall portion an island member communicating with ambient air;

utilizing said island member to communicate ambient air pressure to the openings of said vias on the bottom surface of said package.

4. The method of claim 3 additionally including the steps of:

configuring said island member to include a wall portion spaced within said out wall of said vacuum chuck; and sealingly cooperating said island member wall with said package at a sealing line circumscribing said through vias to isolate said vias from said applied vacuum.

* * * * *